United States Patent
Rodriguez et al.

(10) Patent No.: US 10,763,194 B2
(45) Date of Patent: Sep. 1, 2020

(54) PACKAGE WITH LEAD FRAME WITH IMPROVED LEAD DESIGN FOR DISCRETE ELECTRICAL COMPONENTS AND MANUFACTURING THE SAME

(71) Applicants: STMicroelectronics, Inc., Calamba (PH); STMicroelectronics Pte Ltd, Singapore (SG)

(72) Inventors: Rennier Rodriguez, Bulacan (PH); Bryan Christian Bacquian, Calamba (PH); Maiden Grace Maming, Calamba (PH); David Gani, Choa Chu kang (SG)

(73) Assignees: STMICROELECTRONICS, INC., Calamba (PH); STMICROELECTRONICS PTE LTD, Singapore (SG)

( * ) Notice: Subject to any disclaimer, the term of this patent is extended or adjusted under 35 U.S.C. 154(b) by 0 days.

(21) Appl. No.: 15/713,389

(22) Filed: Sep. 22, 2017

(65) Prior Publication Data

US 2019/0096788 A1    Mar. 28, 2019

(51) Int. Cl.
*H01L 23/495* (2006.01)
*H01L 23/31* (2006.01)
(Continued)

(52) U.S. Cl.
CPC .... *H01L 23/49541* (2013.01); *H01L 21/4825* (2013.01); *H01L 21/4828* (2013.01); *H01L 21/561* (2013.01); *H01L 21/565* (2013.01); *H01L 21/6836* (2013.01); *H01L 21/78* (2013.01); *H01L 23/3114* (2013.01);
(Continued)

(58) Field of Classification Search
CPC ........... H01L 23/49548; H01L 2224/12; H01L 2224/26; H01L 2224/273; H01L 23/49541
See application file for complete search history.

(56) References Cited

U.S. PATENT DOCUMENTS

| | | | |
|---|---|---|---|
| 2002/0031869 A1* | 3/2002 | Minamio | H01L 21/4842 438/127 |
| 2003/0001244 A1* | 1/2003 | Araki | H01L 21/568 257/666 |

(Continued)

*Primary Examiner* — Wael M Fahmy
*Assistant Examiner* — Sarah K Salerno
(74) *Attorney, Agent, or Firm* — Seed IP Law Group LLP

(57) ABSTRACT

A semiconductor package includes a lead frame, a die, a discrete electrical component, and electrical connections. The lead frame includes leads and a die pad. Some of the leads include engraved regions that have recesses therein and the die pad may include an engraved region or multiple engraved regions. Each engraved region is formed to contain and confine a conductive adhesive from flowing over the edges of the engraved leads or the die pad. The boundary confines the conductive adhesive to the appropriate location on the engraved lead or the engraved die pad when being placed on the engraved regions. By utilizing a lead frame with engraved regions, the flow of the conductive adhesive or the wettability of the conductive adhesive can be contained and confined to the appropriate areas of the engraved lead or engraved die pad such that a conductive adhesive does not cause cross-talk between electrical components within a semiconductor package or short circuiting within a semiconductor package.

20 Claims, 9 Drawing Sheets

(51) Int. Cl.
*H01L 21/48* (2006.01)
*H01L 21/56* (2006.01)
*H01L 21/78* (2006.01)
*H01L 23/00* (2006.01)
*H01L 21/683* (2006.01)

(52) U.S. Cl.
CPC .. *H01L 23/49513* (2013.01); *H01L 23/49548* (2013.01); *H01L 23/49589* (2013.01); *H01L 24/97* (2013.01); *H01L 21/568* (2013.01); *H01L 23/3107* (2013.01); *H01L 24/32* (2013.01); *H01L 24/45* (2013.01); *H01L 24/48* (2013.01); *H01L 24/73* (2013.01); *H01L 24/83* (2013.01); *H01L 24/85* (2013.01); *H01L 24/92* (2013.01); *H01L 2221/68345* (2013.01); *H01L 2224/32245* (2013.01); *H01L 2224/45139* (2013.01); *H01L 2224/45144* (2013.01); *H01L 2224/45147* (2013.01); *H01L 2224/48091* (2013.01); *H01L 2224/48106* (2013.01); *H01L 2224/48245* (2013.01); *H01L 2224/48247* (2013.01); *H01L 2224/49171* (2013.01); *H01L 2224/73265* (2013.01); *H01L 2224/83005* (2013.01); *H01L 2224/83192* (2013.01); *H01L 2224/85005* (2013.01); *H01L 2224/92247* (2013.01); *H01L 2224/97* (2013.01); *H01L 2924/0781* (2013.01); *H01L 2924/181* (2013.01); *H01L 2924/19041* (2013.01); *H01L 2924/19105* (2013.01)

(56) References Cited

U.S. PATENT DOCUMENTS

| | | | | |
|---|---|---|---|---|
| 2004/0056337 A1* | 3/2004 | Hasebe | ............... | H01L 23/3107 257/667 |
| 2005/0088806 A1* | 4/2005 | Kato | ................... | H01L 23/3107 361/600 |
| 2005/0173783 A1* | 8/2005 | Chow | .................... | H01L 21/56 257/666 |
| 2007/0093000 A1* | 4/2007 | Shim | ................ | H01L 23/49861 438/123 |
| 2011/0079886 A1* | 4/2011 | Bathan | ................ | H01L 21/4832 257/676 |
| 2011/0147899 A1* | 6/2011 | Dahilig | ................. | H01L 21/568 257/622 |
| 2011/0193208 A1* | 8/2011 | Xue | ........................ | H01L 24/37 257/676 |
| 2012/0074547 A1* | 3/2012 | Do | ...................... | H01L 21/4832 257/676 |
| 2013/0154068 A1* | 6/2013 | Sanchez | ............. | H01L 23/4952 257/675 |

* cited by examiner

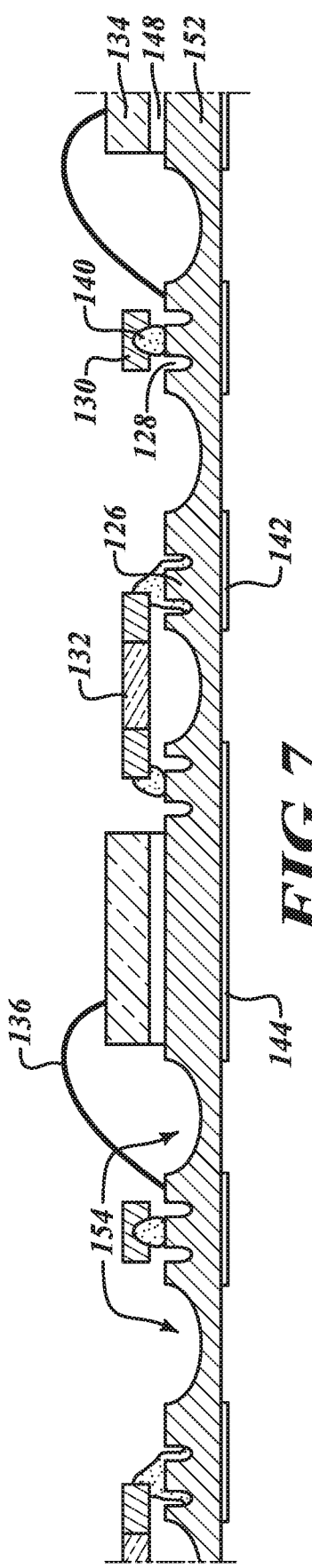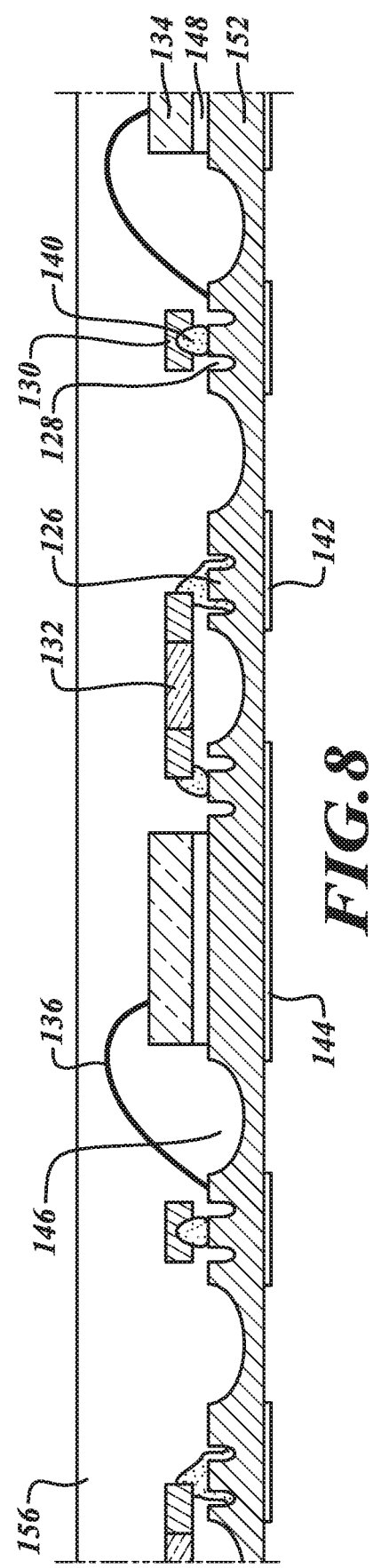

PACKAGE WITH LEAD FRAME WITH IMPROVED LEAD DESIGN FOR DISCRETE ELECTRICAL COMPONENTS AND MANUFACTURING THE SAME

BACKGROUND

Technical Field

The present disclosure is directed to a semiconductor package and a method of manufacturing the semiconductor package having a lead frame that includes leads and a die pad with engravings for mounting discrete electrical components within the semiconductor package.

Description of the Related Art

As consumer demand increases for semiconductor packages, manufacturers face significant challenges to manufacture and form packages including several dice and discrete electrical components with zero defects. When forming a semiconductor package or a system in package (SiP) that includes multiple discrete electrical components, there are various defects that may result within the semiconductor package or system in package (SiP). For example, defects such as short circuiting or unintended electrical connections may result by conductive adhesive being exposed at the bottom of the package. This exposure of the conductive adhesive may be a result of misplacement of the conductive adhesive, too much conductive adhesive being applied when coupling a discrete electrical component within the semiconductor package, or the conductive adhesive having high wettability. In addition, when the conductive adhesive is out of place or exposed on a surface of the semiconductor package, the semiconductor package may be out of specification and unable to be used for its intended purpose. Furthermore, unintended electrical connections or cross-talk between a die, leads, a die pad, or any combination of electrical components within the semiconductor package may result in a faulty or defective semiconductor package. In turn, these defects, such as short circuiting and cross talk, between various electrical connections, multiple components of the semiconductor package, multiple electrical components within an electronic device, or multiple discrete electrical components within the semiconductor package, may result in the semiconductor package or electronic device being less efficient and faulty and out of specification.

One method of forming a semiconductor package is by using a lead frame made of a conductive material. The lead frame includes a die pad and a plurality of leads. First, a conductive adhesive is placed on some leads of the plurality of leads. After the conductive adhesive is placed, discrete electrical components are coupled by the conductive adhesive between pairs of the leads by the conductive adhesive. Once the discrete electrical components have been coupled to pairs of the leads, a die is coupled to the die pad of the lead frame by a conductive adhesive. Once the die is coupled to the die pad, electrical connections are formed between respective leads of the plurality of leads and the die. These electrical connections may be formed by a plurality of wires. After the electrical connections are formed between the die and the respective leads of the plurality of leads, a molding compound is placed to encase the lead frame, the discrete electrical components, and the electrical connections.

The above formation process is utilized to form several semiconductor packages in a single manufacturing batch. Unfortunately, when utilizing the above formation process, the conductive adhesive that couples the discrete electrical components to the leads can be misplaced or displaced resulting in unwanted or unintended electrical connections. These unwanted electrical connections can then cause the semiconductor package to work in unintended manners, be inefficient, or be faulty. For example, short circuiting and cross-talk may result between multiple leads and the die pad in the semiconductor package due to overflow, improper displacement, or misplacement of the conductive adhesive within the semiconductor package. Similarly, unwanted or unintended electrical connections may be formed with components outside the semiconductor package due to overflow in the conductive adhesive that results in the conductive adhesive being exposed on an outer surface of the semiconductor package. Other difficulties exist as well. First, if too little of the conductive adhesive is utilized to couple the discrete electrical components to the leads, the electrical connections may be physically weak. Similarly, if not enough conductive adhesive is utilized to couple the discrete electrical components to the leads, a poor electrical connection between the leads and the discrete electrical component may be formed. Third, utilizing a conductive adhesive with a high wettability may result in rejected or out of specification packages due to the tight space clearance desired between the discrete electrical component, the conductive adhesive, and an edge of a lead or various components within the semiconductor package such as a die, a die pad, electrical connections, or other electrical and conductive components.

BRIEF SUMMARY

The present disclosure provides semiconductor packages formed by utilizing leads and die pads that have engraved regions to control the flow of a conductive adhesive when forming electrical connections within a semiconductor package. In the method to form these semiconductor packages, selected locations on a second side of the lead frame are covered in a conductive material. The conductive material may be a selectively chemically resistant conductive material. Some of the selected locations covered in the conductive material will be used to form the die pads of the lead frame and some of the selected locations covered by the conductive material will be used to form the leads of the lead frame. After the selected locations are covered in the conductive material, discrete electrical components are coupled to the engraved regions of the leads and die pads of the lead frame. The engraved regions of the leads and the die pads of the lead frame include a low region and a high region. More specifically, the low region surrounds and is adjacent to the high region. In other words, the low region is a recess, a valley, or a trough that surrounds and defines the high region, which is a ridge or a hill. The high regions include a top surface to couple a discrete electrical component within the semiconductor package to respective engraved regions of respective leads or respective die pads of the lead frame. The recesses of the engraved regions are configured to collect excess conductive adhesive to control the flow or wetting of the conductive adhesive as the discrete electrical components are coupled to various leads and die pads of the lead frame by the conductive adhesive. The discrete electrical components are coupled to the top surfaces of the high regions of the engraved regions of the leads and the die pads of the lead frame. Once the discrete electrical components are coupled to respective engraved regions of the leads and the die pads of the lead frame, a die is coupled to the die pad of the lead frame as well. However, in alternative methods, the die may be coupled to the die pad before the discrete electrical components are coupled to the leads or the die pad. The die is coupled to the die pad by an adhesive material. For example, this adhesive material may be a die attach film, a glue, or some other adhesive material. In addition, this adhesive material may be conductive. Once the die is coupled to the die pad of the lead frame, electrical connections are formed between the die and respective leads of the semiconductor package. These leads of the semiconductor packages may include the leads with the engraved regions coupled to the discrete electrical components and leads that do not have engraved regions. After the electrical connections are formed between the die and various leads, a molding compound is placed to encase the lead frame, the die, the discrete electrical components, and the electrical connections. After the molding compound is placed and cured, portions of the second side of the lead frame are removed to physically and electrically separate the die pads and the leads of the semiconductor packages. After the portions of the second side of the lead frame are removed, the semiconductor packages are singulated into individual semiconductor packages.

According to one embodiment, a package is formed having a plurality of leads, a die pad, a die, a plurality of wires, and a molding compound. The die pad and some of the leads have engraved regions that include a high region and a low region. The low region of the engraved regions acts as a trough or recess to collect excess conductive material when forming electrical connections between discrete electrical components, the die pad, or the leads. Some leads of the plurality of leads are engraved leads, and other leads of the plurality of leads are not engraved. Also, electrical connections are formed between the other leads and the die. Although these components are encased in the molding compound to form semiconductor packages, surfaces of the leads and the die pads are left exposed so the semiconductor package may be mounted within or to an electronic device.

By utilizing leads and die pads with engraved regions, the conductive adhesive that is used to couple the discrete electrical components to the leads and die pads can be controlled with greater ease. In other words, engravings of the engraved regions can collect conductive adhesive that may have originally overflowed into areas where the conductive adhesive was unwanted. In turn, this significantly reduces the chances of forming unwanted electrical connections or cross-talk within the semiconductor packages or to other electrical components outside the semiconductor packages. Likewise, by utilizing a little extra conductive adhesive so the conductive adhesive fills or partially fills the engraved regions when coupling discrete electrical components to the leads and the die pads engraved regions, a strong physical connection and a better electrical connection will be formed within the semiconductor package between the discrete electrical components and the leads or the die pads. In turn, by having engraved regions on the leads and the die pads, the chances of short circuiting and cross-talk within the semiconductor package are significantly reduced. In addition, semiconductor packages with high tolerance specifications can be formed with high consistency.

BRIEF DESCRIPTION OF THE SEVERAL VIEWS OF THE DRAWINGS

In the drawings, identical numbers identify similar elements or acts unless the context indicates otherwise. The sizes and relative positions of elements in the drawings are not necessarily drawn to scale.

FIGS. 4-10 are cross-sectional side views of successive steps of a method utilizing an engraved lead frame to form an embodiment of the completed semiconductor packages having discrete electrical components coupled to engraved regions of the lead frame;

DETAILED DESCRIPTION

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Figure 1A:
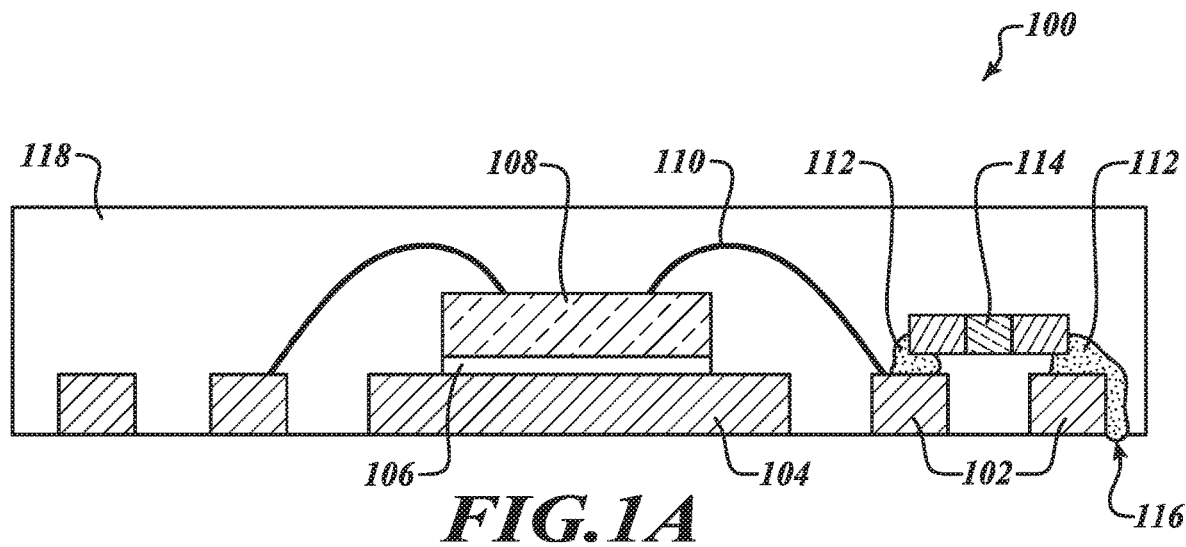
FIG. 1A is a cross-sectional side view of a semiconductor package showing the problems of the prior art.

FIG. 1A illustrates a semiconductor package 100 formed by a semiconductor package formation process. The package 100 includes a plurality of leads 102, a die pad 104, a die 108, a discrete electrical component 114, a plurality of electrical connections 110, and a molding compound 118.

In this package 100, the discrete electrical component 114 is coupled electrically and physically to a pair of leads of the plurality of leads 102. The discrete electrical component 114 is coupled to the pair of leads 102 by a conductive adhesive 112. The conductive adhesive 112 may be a conductive glue or some other conductive adhesive material. Furthermore, the die 108 is coupled to the die pad 104 by an adhesive 106. The adhesive 106 may be a die attach film, a conductive adhesive material, or some other adhesive material. In addition, the die 108 is coupled to one respective lead of the pair of leads 102 coupled to the discrete electrical component 114. The die 108 is coupled to the one respective lead of the pair of leads 102 by an electrical connection 110. The electrical connection may be formed by a wire 110. Likewise, the die 108 is coupled to a lead of the plurality of leads 102 that is not coupled to the discrete electrical component 114. The die 108 may be coupled to the lead of the plurality of leads 102 that is not coupled to the discrete electrical component by an electrical connection 110. This electrical connection 110 may be in the form of a wire 110. Additionally, a molding compound 118 encases the plurality of leads 102, the die pad 104, the die 108, the discrete electrical component 114, and the plurality of electrical connections 110. In addition, however, the molding compound 118 leaves exposed surfaces of the die pad 104 and the plurality of leads 102 so the package can be mounted within an electronic device. For example, the electronic device may be a calculator, a laptop, a tablet, a cellphone, or some other electronic device.

To form this semiconductor package 100, a semiconductor package formation process is utilized. In this formation process, a lead frame is utilized to form the semiconductor package 100.

In this formation process, a discrete electrical component is coupled directly to a pair of leads 102 of the plurality of leads 102. The discrete electrical component is coupled to the pair of leads 102 physically and electrically by a conductive glue 112. Furthermore, each lead of the pair of leads 102 coupled to the discrete electrical component 114 is adjacent to the other. After the discrete electrical component 114 is coupled to the pair of leads 102 of the lead frame, a die 108 is coupled to the die pad 104 by a die attach film 106. Once the die 108 is coupled to the die pad 104 by the die attach film 106, a plurality of electrical connections 110 is formed. The plurality of electrical connections 110 is formed by a plurality of wires 110. Some of the wires of the plurality of wires 110 have a respective first end coupled to the die 108 and a respective second end coupled to a lead that is not coupled to the discrete electrical component 114. Similarly, a respective wire of the plurality of wires 110 has a respective first end coupled to the die 108 and a respective second end coupled to at least one lead of the pair of leads 102 that is coupled to the discrete electrical component 114. After the electrical connections 110 are formed, a molding compound 118 is placed to encase the plurality of leads 102, the die pad 104, the die 108, the electrical connections 110, and the discrete electrical component 114. After the molding compound 118 is placed, the molding compound 118 is allowed to cure. After the molding compound 118 has been cured, the semiconductor packages 100 are singulated into individual semiconductor packages 100.

An alternative semiconductor formation process is the same as the above semiconductor formation process except in one step. After the molding compound 118 is allowed to cure, the plurality of leads 102 and die pad 104 are still physically and electrically connected at an exposed surface of the lead frame. At this point, the plurality of leads 102 and the die pad 104 are physically and electrically separated on the exposed surface by an etching step. This etching step removes portions from the exposed surface of the lead frame to physically and electrically separate the plurality of leads 102 and the die pad 104. A completed alternative semiconductor package 200 formed by this alternative formation process is illustrated in FIG. 1B.

Figure 1B:
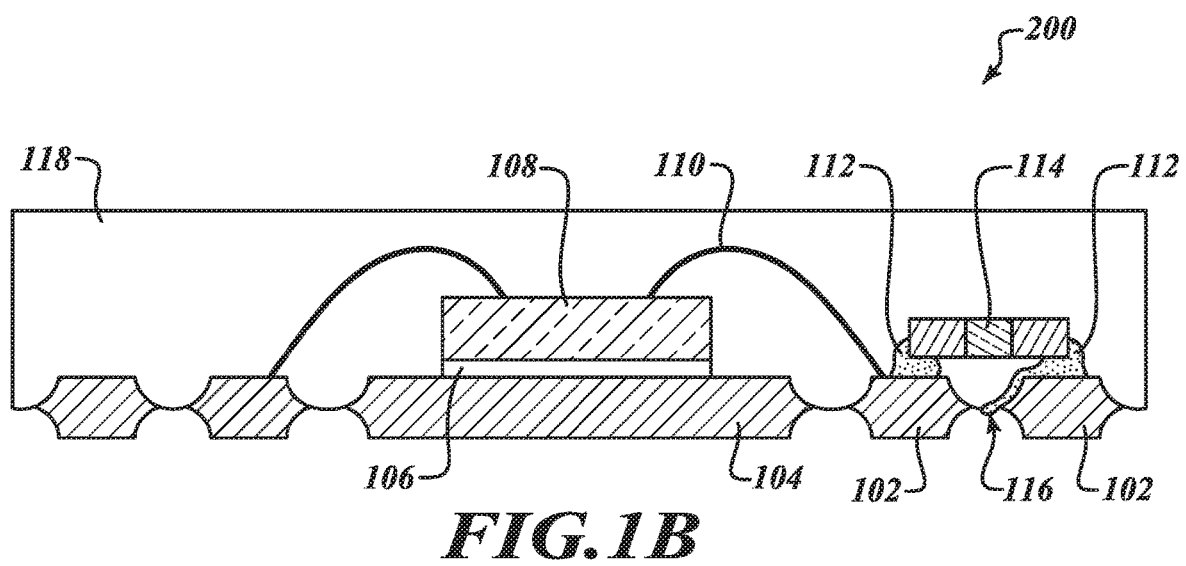
FIG. 1B is a cross-sectional side view of a semiconductor package showing the problems of the prior art.

In both of the above semiconductor packages of FIGS. 1A and 1B, there is an area where the conductive glue 112 has been pushed out of place and exposed conductive glue 116 on a surface of the semiconductor packages 100, 200. This displaced conductive glue 116 in FIG. 1A can result in unwanted electrical connections when mounted within an electronic device. Likewise, if the displaced conductive glue 116 moves towards other electronic components within the semiconductor package 200, as in FIG. 1B, the displaced conductive glue 116 may cause cross-talk between multiple leads, multiple electrical components, or between a lead 102 and a die pad 104 within the semiconductor package 200. This cross-talk will result in a faulty or inefficient semiconductor package 200. In addition, if there is a high tolerance specification for where the conductive glue 112 can be positioned on the lead 102, and the wettability of the conductive glue 112 is high, it is incredibly difficult to keep the conductive glue 112 from flowing or moving into unwanted or undesired locations within the semiconductor packages 100, 200. In other words, if the conductive glue 112 has a high wettability, then it is incredibly difficult to control where the viscous conductive glue 112 will end up when the conductive glue 112 with high wettability is placed on respective leads 102. Similarly, when using the conductive glue 112 with high wettability to couple discrete electrical components 114 to leads 102 within the semiconductor packages 100, 200, the conductive glue 112 with high wettability may be displaced into unwanted locations 116 of the semiconductor packages 100, 200 as the discrete electrical components 114 are placed.

This example illustrates the shortcomings the inventors realized as problems that should be solved in the semiconductor packages 100, 200 which utilize a formation process that includes coupling discrete electrical components to leads within semiconductor packages 100, 200.

The present disclosure describes a semiconductor package and formation process that overcomes many of the shortcomings of the semiconductor packages 100, 200 above. The present disclosure describes various embodiments of semiconductor packages being formed by utilizing a lead frame with engravings to significantly increase the efficiency of semiconductor packages and reduce the number of defects due to displacement of an adhesive material within semiconductor packages that include discrete electrical components.

FIGS. 2A-2E illustrate one embodiment of the present disclosure for providing a semiconductor package 300 having a lead frame 152 that includes leads 122, engraved leads 124, and an engraved die pad 138. Furthermore, the semiconductor package 300 includes a molding compound 120, discrete electrical components 130, 132, a die 134, and electrical connections 136.

Figure 2A:
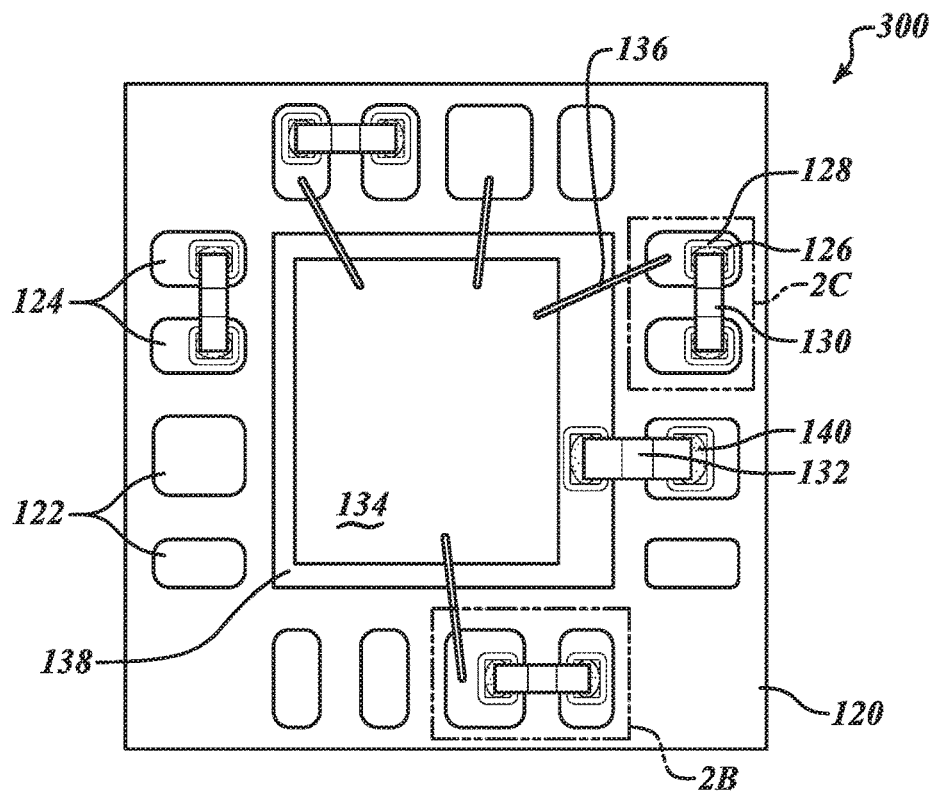
FIG. 2A is a top plan view of an inventive completed semiconductor package formed by utilizing a disclosed method with an engraved lead frame.

FIG. 2A is a top plan view of the semiconductor package 300. The engraved leads 124 of the lead frame 152 include an engraved region. Each engraved region includes a high region 126 and a low region 128, the high region 126 being a hill 126 and the low region 128 being a recess 128. The recess 128 is adjacent to the hill 126 and surrounds the hill 126. Similar to the engraved leads 124, a die pad 138 also has an engraved region in this embodiment. However, in alternative embodiments, the die pad may not have an engraved region. The engraved region of the die pad 138 includes a hill and a recess like the engraved leads 124. The recess is adjacent to and surrounds the hill. The engraved regions of the lead frame 152 may be any shape or size, such as a circle, an oval, a rectangle, a square, or any other shape or size or combinations of shapes or sizes. Furthermore, discrete electrical components 130, 132 are coupled to engraved regions of the die pad 138, the engraved leads 124, or both. More specifically, each of the discrete electrical components 130, 132 has a first end coupled to a first respective engraved region and a second end coupled to a second respective engraved region. The first and the second respective engraved regions may be a pair of engraved regions between two adjacent engraved leads 124, or may be an engraved region of the die pad 138 and an engraved region of an engraved lead 124. Additionally, the discrete electrical components 130, 132 are coupled to the engraved regions by an adhesive material 140. The adhesive material 140 is a conductive adhesive material. The discrete electrical components 130, 132 may be resistors, inductors, capacitors, semiconductors, or some other discrete electrical component or combinations of discrete electrical components. Also, electrical connections 136 may be formed between the die and some of the engraved leads 124, between the die and some of the leads 122, or both. In addition, the die 134 is coupled to the die pad 138 at a die attach region 139. The die 134 is coupled to the die pad 138 by an adhesive material 148 at the die attach region 139. The adhesive material 148 may be a conductive adhesive material, a die attach film, or some other adhesive material or combination of adhesive materials. A molding compound 120 then encases the leads 122, the engraved leads 124, the die 134, the electrical connections 136, and the die pad 138. However, the molding compound leaves a surface of each lead 122, each engraved lead 124, and the die pad 138 exposed so the semiconductor package 300 can be mounted within or to an electronic device. For example, the electronic device may be a cellphone, a tablet, a computer, a laptop, a calculator, or some other electronic device.

Figure 2B:
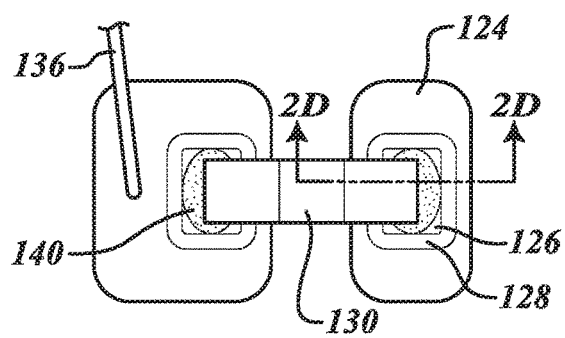
FIG. 2B is an enlarged top plan view of a discrete electrical component coupled to engraved regions of a lead frame in the inventive completed semiconductor package, as shown in dashed rectangle 2B in FIG. 2A.
Figure 2C:
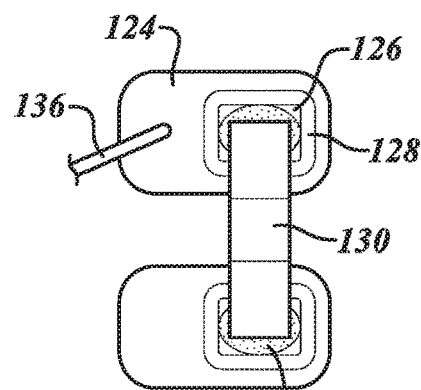
FIG. 2C is an enlarged top plan view of a discrete electrical component coupled to engraved regions of the lead frame in the inventive completed semiconductor package, as shown in dashed rectangle 2C in FIG. 2A.

FIGS. 2B and 2C are enlarged views of discrete electrical components 130, 132 coupled to a pair of adjacent engraved leads 124. As shown in these enlarged views of FIGS. 2B and 2C, each recess 128 forms a perimeter around a respective hill 126 of an engraved region of an engraved lead 124.

Figure 2D:
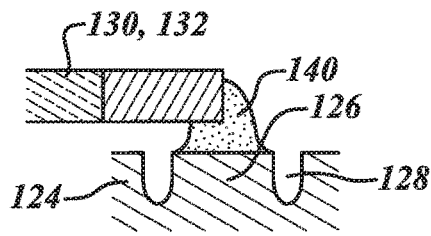
FIG. 2D is a cross-sectional side view taken along 2D-2D in FIG. 2B of the discrete electrical component coupled to engraved regions of the lead frame.
Figure 3:
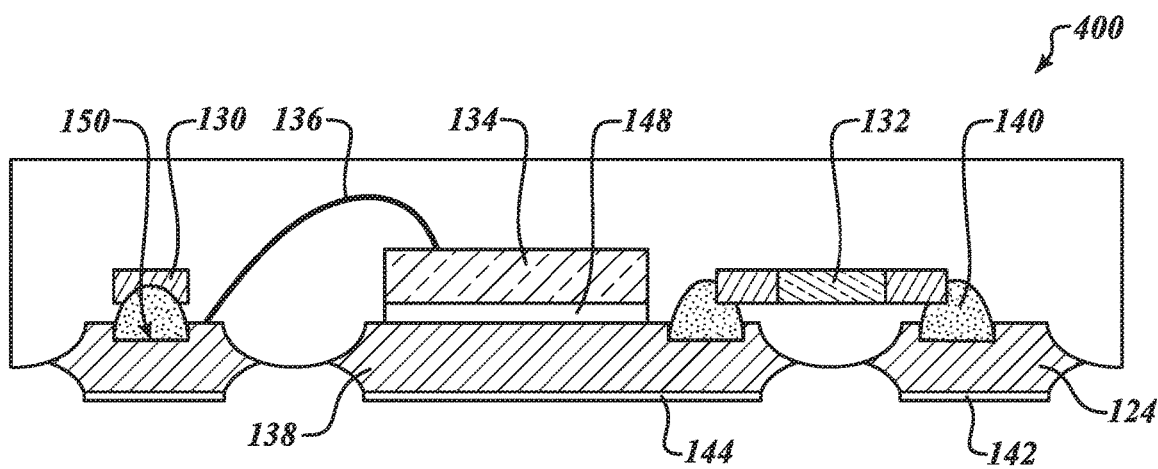
FIG. 3 is a cross-sectional side view of an alternate embodiment of the inventive completed semiconductor package.

FIG. 2D is a cross-sectional side view taken along 2D-2D in FIG. 2B. As shown in FIG. 2D, an end of the discrete electrical component 130 is coupled to a hill 126 of an engraved region of an engraved lead 124. The discrete electrical component 130 is coupled to the hill 126 of the engraved lead by a conductive adhesive material 140. Furthermore, in this embodiment, if the conductive adhesive material 140 is displaced or pushed outwards towards the edge of the engraved lead 124, the recess 128 will act as a trough and collect the excess conductive adhesive material 140 that is displaced outwards. In other words, the recess 128 forms a perimeter or a boundary around the hill of the engraved lead to significantly reduce the chances of the conductive adhesive material 140 reaching an edge of the engraved lead 124. In an alternative embodiment, each engraved lead 124 may have a first recess and a second recess. The first recess may be positioned on one side of a hill of an engraved lead and the second recess may be positioned opposite to the first recess on an opposite side of the hill of the engraved lead. In other words, the recesses 128 of the engraved lead may form a perimeter around a hill 126 of each engraved lead 124, may be a plurality of distinct recesses, or may be a recess 128 that does not form a complete perimeter or a boundary around a hill 126. More specifically, the recess 128 may have any shape or size to reduce the chances of a conductive adhesive material 140 reaching the edges of an engraved lead 124. Alternatively, in an alternative embodiment, each engraved lead 124 and engraved die pad 138 may only include recesses 128 and no hills 126. This alternative embodiment is illustrated in FIG. 3. Also, any of the above embodiments of the engraved regions of the engraved leads 124 and die pads 138 may be utilized in any combination.

The recess 128 can be formed by any acceptable technique, including wet etch, laser etch, silk screen pattern and etch, machining, or other acceptable method. They can be formed by the party making the lead frame or by the party who is placing the die and the molding the final package, the parts being equivalent to each other and the location and timing of forming being equivalent.

Figure 2E:
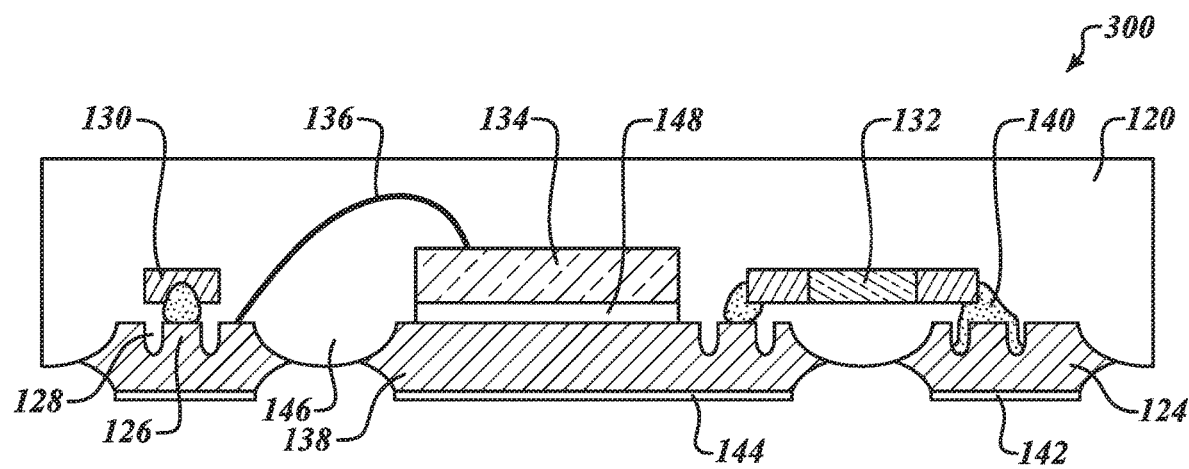
FIG. 2E is a cross-sectional side view of an embodiment of an inventive completed semiconductor package.

FIG. 2E illustrates a cross-sectional side view of an embodiment of the completed semiconductor package 300 of the present disclosure. However, in this completed semiconductor package 300, the conductive adhesive material 140 has been displaced into the recess 128 of one engraved lead 124 when coupling one of the discrete electrical components 132 to the engraved lead 124 and the engraved region of the die pad 138. Thus, the recess 128 acts as a boundary for the conductive adhesive 140 that was displaced or was approaching an edge of the engraved lead 124. In other words, the recess 124 stopped the conductive adhesive 140 from reaching the edge of the lead, in turn, stopping the conductive adhesive 140 from being displaced into an undesired location within the semiconductor package 300. A portion 146 of the molding compound 120 is between the engraved leads 124 and the die pad 138 of the lead frame.

FIG. 3 illustrates a cross-sectional side view of an alternative embodiment of a completed semiconductor package 400 of the present disclosure. Similar to the embodiment of the completed semiconductor package 300 in FIG. 2E, in this alternative embodiment of the completed semiconductor package 400, the completed semiconductor package 400 includes a lead frame 152, discrete electrical components 130, 132, a die 134, and a molding compound 120. The lead frame 152 includes an engraved die pad 138 and engraved leads 124. However, unlike the completed semiconductor package 300 where the engraved leads 124 have the high region 126 and the low region 128, in this alternative embodiment of the completed semiconductor package 400, the engraved leads 124 have an engraved region in the form of a low region 150, such as a recess. The walls of the recess 150 on the engraved leads 124 act as a boundary to stop a conductive adhesive 140 from being displaced towards the edge of the engraved lead 124. Thus, similar to the engraved leads 124 in the completed semiconductor package 300, in this alternative embodiment of the completed semiconductor package 400, the walls of the recesses 150 act in the same manner as the hill 126 and the trough 128 combination in the embodiment of the completed semiconductor package 300 in FIG. 2E.

Figure 4:
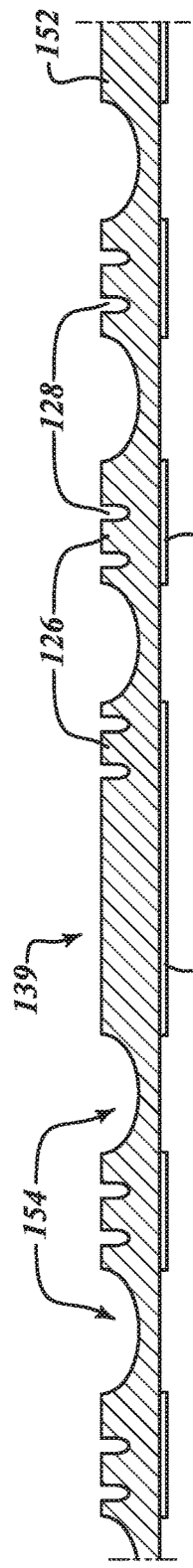

FIGS. 4-10 illustrate a method of forming an embodiment of a completed semiconductor package 300 that have engraved leads 124. FIG. 4 illustrates a cross-sectional side view of a lead frame 152. The lead frame 152 includes a plurality of leads 122, 124 and a plurality of die pads 138. The plurality of leads includes leads 122 and engraved leads 124. The engraved leads 124 have engraved regions that include a high region 126 and a low region 128. In other words, the high region 126 is a hill or a ridge, and the low region 128 is a trough, a valley, or a recess that acts as a boundary to contain a conductive adhesive 140 from flowing into unwanted locations within semiconductor packages 300, 400 during formation. For example, these unwanted locations may be an edge of a lead adjacent to a die pad, an edge of a lead adjacent to another lead, or an outside surface of a semiconductor package. However, in alternative embodiments, the engraved leads 124 may be a recess 150 with walls that act as a boundary to contain a conductive adhesive 140. Furthermore, the lead frame 152 is made of a conductive material. This conductive material may be silver, gold, copper, or any other conductive material or combinations of conductive materials.

In this embodiment, each low region 128 of the engraved leads 124 is adjacent to a respective high region 126 of the engraved leads. Furthermore, each low region 128 is positioned between the respective high region 126 and respective edges of the engraved lead 124. Furthermore, the lead frame 152 has a first side and a second side. The first side includes the engraved regions of the engraved leads 124. Similarly, the first side includes the engraved region of the die pad 138. The engraved region of the die pad 138 may be a high region 126 and a low region 128, may be a recess 150 with walls, or may be some other engraving. However, in this embodiment, the engraved region of the die pad 138 includes the high region 126 and the low region 128 similar to the engraved leads 124. The second side of the lead frame 152 includes selected locations 142, 144 covered in a conductive material. The conductive material may be a selectively chemically resistant conductive material. Some of the selected locations 142 of the conductive material cover the second sides of the leads 122 and the engraved leads 124, and some of the selected locations 144 of the conductive material cover the second sides of the die pads 138. However, in alternative embodiments, the selected locations 142, 144 of the second side of the lead frame 152 may not be covered at all. Additionally, the lead frame 152 includes recesses 154 between the leads 122, the engraved leads 128, and the die pads 138 of the lead frame 152.

Figure 5:
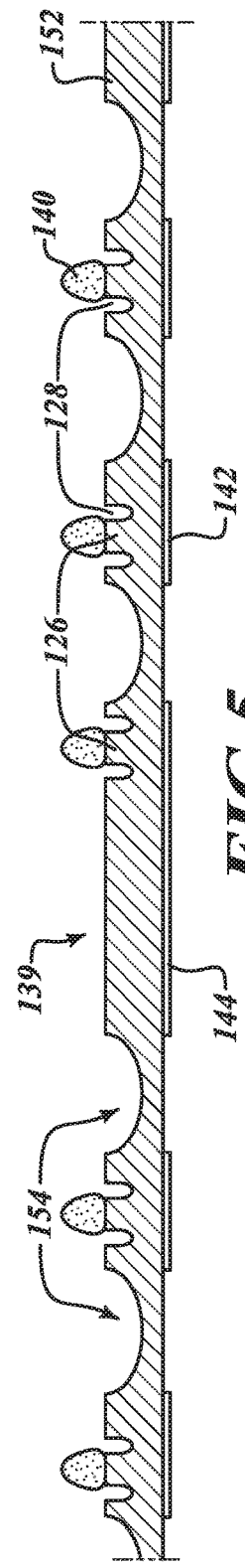

FIG. 5 illustrates placing a conductive adhesive 140 on the high regions 126 of the engraved regions of the engraved leads 124. The conductive adhesive 140 may be a conductive glue, a conductive material with high wettability, or any other conductive adhesive material. For example, the conductive adhesive may be a conductive glue such as Henkel Adhesives' ICP 3535M1 or Henkel Adhesives' 9507-2C2. However, in alternative embodiments, it may be another conductive glue, conductive adhesive, or combinations of conductive adhesives.

Figure 6:
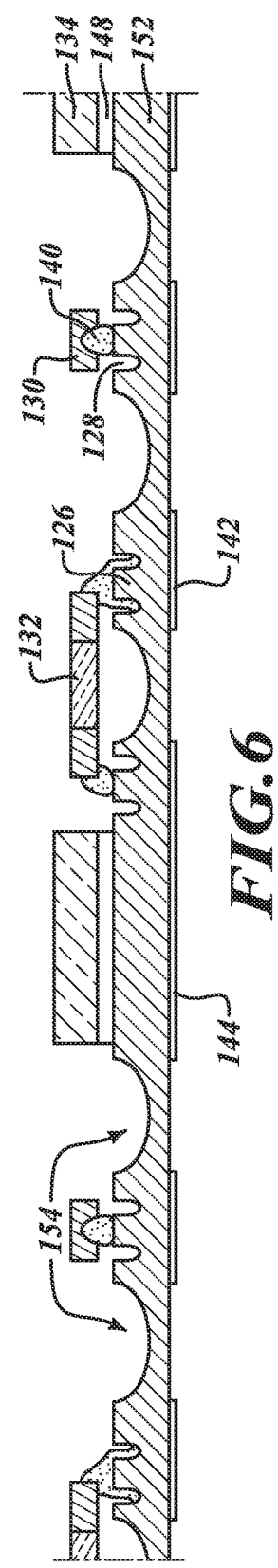

After the conductive adhesive 140 has been placed on the high regions 126 of the lead frame 152, discrete electrical components 130, 132 and a die 134 are coupled to the lead frame 152. FIG. 6 shows the die 134 being coupled to a die attach region 139 of the die pad 138 by an adhesive 148. The adhesive 148 may be a conductive adhesive, a die attach film, a glue, or some other adhesive material or combination of adhesive materials. Furthermore, the discrete electrical components 130, 132 include first discrete electrical components 130 and second discrete electrical components 132 coupled to the engraved regions of the lead frame 152. The first discrete electrical components 130 are coupled to high regions 126 of adjacent engraved leads 124. Similarly, the second discrete electrical components 132 are coupled to a high region 126 of a respective engraved lead 124 and a high region of the die pad 138. The die pad 138 may have one engraved region, a plurality of engraved regions, or no engraved regions. The discrete electrical components 130, 132 may be resistors, inductors, capacitors, semiconductors, or some other discrete electrical components or combinations of discrete electrical components.

Furthermore, as illustrated in FIG. 6, some of the conductive glue 140 has spilled into the low region 128 of one of the engraved leads 124. Thus, by having the high regions 126 and the low regions 128, which are adjacent to and form a perimeter around the high region 126, a boundary is formed to contain the flow of the conductive adhesive 140 if its wettability is high or if it is highly viscous. In turn, the high region 126 and the low region 128 combination confines the conductive adhesive 140 to an appropriate location of the completed semiconductor package 300 and significantly reduces defects due to displacement of the conductive adhesive when coupling the discrete electrical components 130, 132 to the lead frame 152.

Additionally, if slightly more conductive adhesive 140 is utilized than needed such that the conductive adhesive 140 partially flows into the low regions 128 of the engraved leads 124 when coupling the discrete electrical components 130, 132 to the lead frame 152, a stronger physical and electrical connection is formed between the lead frame 152 and each discrete electrical component 130, 132. A stronger physical connection is formed because the conductive adhesive 140 interlocks and covers a greater portion of the high regions 126 of the engraved leads 124. Similarly, a stronger electrical connection is formed because the conductive adhesive 140 covers a greater surface area of the engraved regions of the engraved leads 124.

After the discrete electrical components 130, 132 and the die 134 are coupled to the lead frame 152, as illustrated in FIG. 7, electrical connections 136 are formed. The electrical connections 136 may be formed by wires, solder, or some other electrical connection technique. In this embodiment, electrical wires form the electrical connections 136. The electrical wires 136 may be made of copper, silver, gold, or some other conductive material or combination of conductive materials. The electrical connections 136 may be formed between the die 134 and a respective engraved lead 124, the die 134 and a respective lead 122, or any other combination of electrical connections 136 may be formed within the semiconductor packages 300, 400.

After the electrical connections 136 are formed, a molding compound 156 is placed on the first side of the lead frame 152 that is covering the die 134, the discrete electrical components 130, 132, and the electrical connections 136. The molding compound 156 also fills the recesses 154 of the lead frame 152. FIG. 8 illustrates the molding compound 156 being placed on the first side of the lead frame 152. After the molding compound 156 is placed, the molding compound 156 is allowed to cure. At this point, the die pad 138, the engraved leads 124, and the leads 122 are still physically and electrically connected by the second side of the lead frame 152. Portions 146 of the molding compound 156 will separate the die pads 138, the engraved leads 124, and the leads 122 after cutting and singulation of the semiconductor packages 300, 400 into individual packages.

Figure 9:
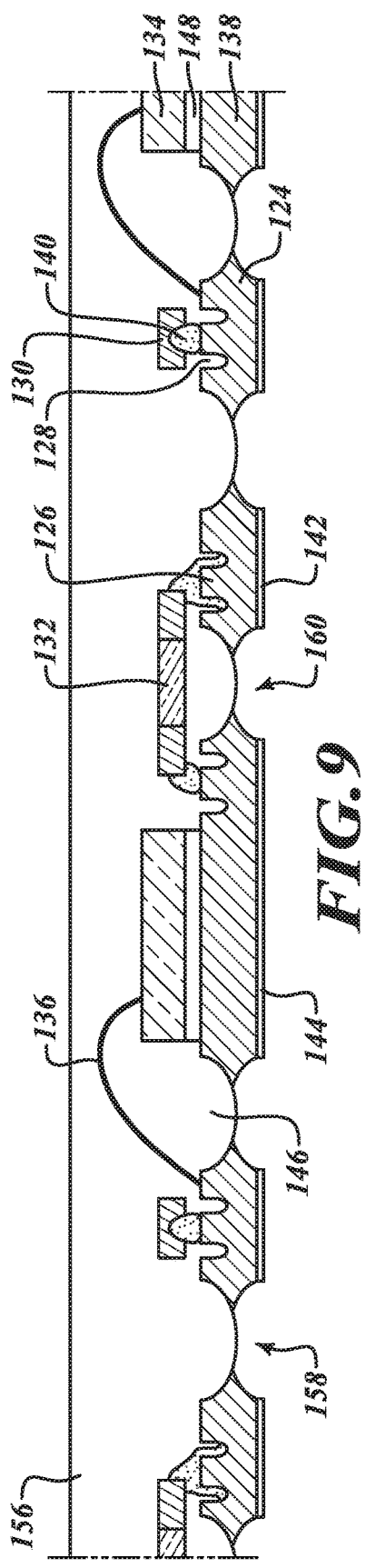

After the molding compound has been placed and cured, as illustrated in FIG. 9, portions of the second side of the lead frame 152 are removed. These portions may be removed by chemical etching, laser etching, or some other etching technique. However, in this method, a chemical etching step is carried out. More specifically, the conductive material 142, 144 covering selected locations of the second side of the lead frame 152 is a selectively chemically resistant conductive material that protects portions of the leads 122, 124 and the die pad 138 from the chemical etch. This allows for portions between the selectively chemically resistant conductive materials 142, 144 to be removed. In turn, this removing of portions from the second side of the lead frame 152 electrically and physically separates the leads 122, the engraved leads 124, and the die pads 138. However, if the etching step is not a chemical etching step, the second side of the lead frame 152 does not have selected locations 142, 144 covered by the selectively chemically resistant conductive material. Portions 146 of the molding compound 156 will separate the die pads 138, the engraved leads 124, and the leads 122 after cutting and singulation of the semiconductor packages 300, 400 into individual packages.

Figure 10:
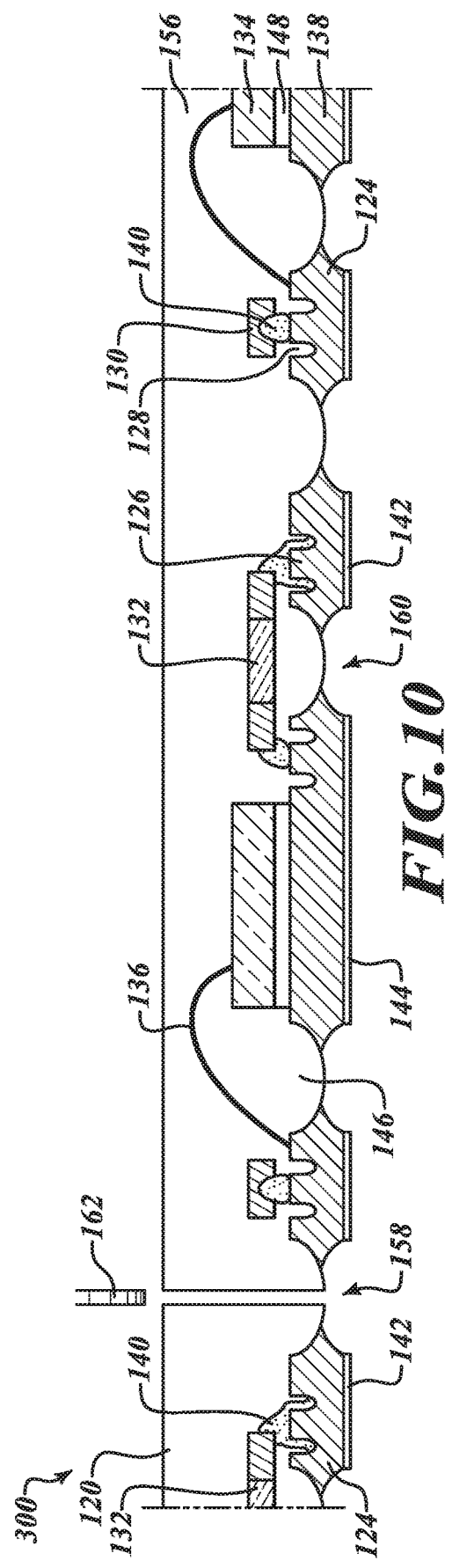

After the portions of the second side of the lead frame 152 are removed by the etching step, the various components are singulated into individual semiconductor packages 300. The singulation of the various components into individual semiconductor packages 300 is illustrated in FIG. 10. The semiconductor packages 300 may be singulated into individual semiconductor packages by saw singulation, laser singulation, or some other singulation technique. However, in this method, a cutting device 162, such as a saw is used to singulate the individual semiconductor packages 300. The cutting device 162, which can be a saw, a laser, or some other cutting device, singulates the semiconductor packages into individual semiconductor packages 300 at singulation locations 158.

Figure 11:
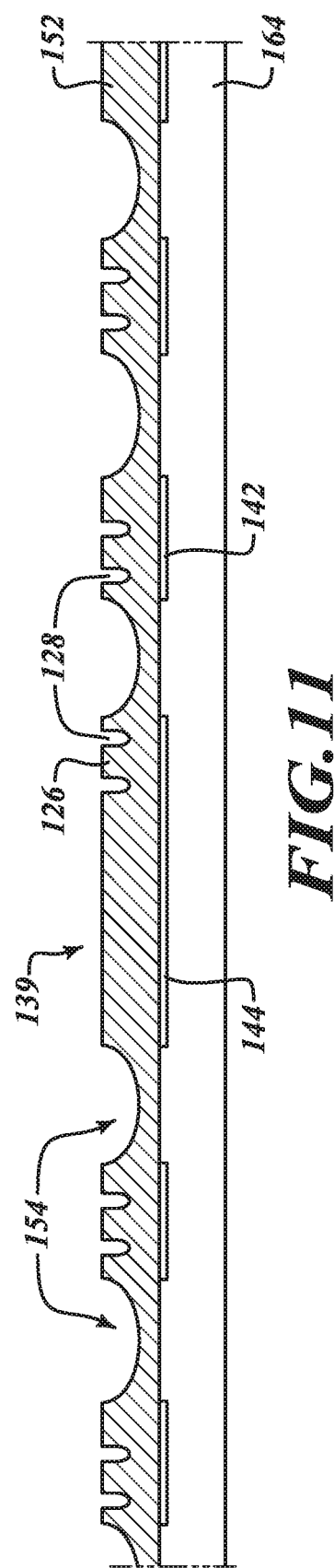
FIG. 11 is a cross-sectional side view of an alternative embodiment of a method utilizing an engraved lead frame to form an embodiment of the inventive completed semiconductor packages having discrete electrical components coupled to engraved regions of a lead frame.

In alternative embodiments of the above method of forming semiconductor packages 300 with engraved leads 124, a support 164 is coupled to the lead frame 152 before the conductive adhesive 140 is coupled to high regions 126 of the lead frame 152. The support 164 allows for the lead frame 152 to have greater rigidity to reduce defects in the semiconductor packages during the above formation process. This step in the alternative embodiment of the above method of forming semiconductor packages 300 with engraved leads 124 is shown in FIG. 11. The support 164 may be a lead frame tape, a removable support material, or some other supporting technique.

Figure 12:
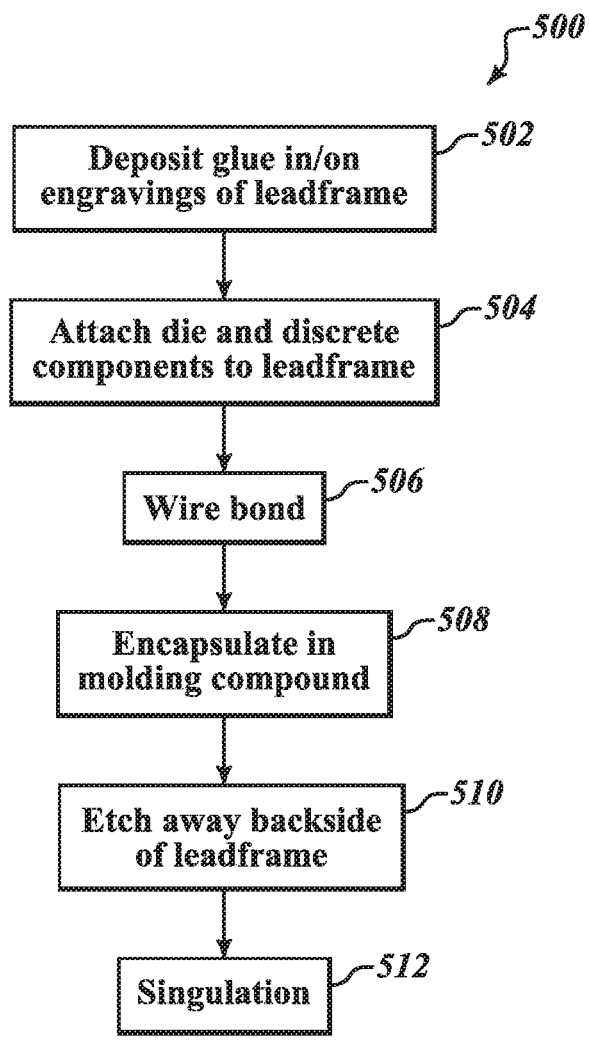
FIG. 12 is a flow chart diagram of successive steps of a semiconductor package formation process utilizing a lead frame with engraved regions according to FIGS. 4-10.

FIG. 12 is directed to a flow chart 500 of the method illustrated in FIGS. 4-10. More specifically, FIG. 12 illustrates a flow chart diagram 500 summarizing a method of manufacturing hundreds, thousands, or any number of semiconductor packages 300, 400 in a large array at one time utilizing a lead frame that includes leads 122, 124 and die pads 138. In this method, the leads 122, 124 include leads 122 and engraved leads 124, the engraved leads 124 having engraved regions that include a high region 126 and a low region 128. Additionally, the die pads 138 may have engraved regions like the engraved leads 124.

The first step 502 is to deposit an adhesive 140 onto the high regions 126 of the engraved regions of the engraved leads 124 and engraved regions of the die pads 138. The adhesive 140 is a conductive adhesive 140. This step 502 is illustrated in FIG. 5. The conductive adhesive 140 will be utilized later in the method to form electrical and physical connections between the high regions of the engraved leads 124 and the die pads 138, and discrete electrical components 130, 132. Furthermore, the conductive adhesive 140 may be deposited onto the high regions 126 by dispensing the conductive adhesive 140 onto the high regions 126. More specifically, the conductive adhesive 140 may be a conductive glue that is transferred glue dispensed onto the high regions 126 of engraved regions of the lead frame 152. For example, this transferred glue dispensing may be carried out by a Datacon 2200 Evo.

After the conductive adhesive 140 is deposited onto the high regions 126 of the engraved leads 124 and the die pads 138, the second step 504 is carried out. In the second step 504, dice 134 and discrete electrical components 130, 132 are attached to the lead frame 152. This step 504 is illustrated in FIG. 6. More specifically, the dice 134 are attached to respective die attach regions 139 of die pads 138 of the lead frame 152. The dice are attached to the respective die attach regions 139 by an adhesive 148 such as a die attach film. Additionally, the discrete electrical components 130, 132 are coupled to respective engraved regions of the engraved leads 124 and the die pads 138 by placing the discrete electrical components 130, 132 on the conductive adhesive 140 on the lead frame 152. For example, this placement of the dice 134 and the discrete electrical components 130, 132 may be carried out by a Siemens Siplace D2 machine.

After the dice 134 are coupled to the die attach regions 139, and the discrete electrical components 130, 132 are coupled to respective engraved regions of the lead frame 152, the third step 506 is carried out. In the third step 506, electrical connections 136 are formed. These electrical connections 136 may be wires, solder, or some other electrical connection technique. The electrical connections 136 may be formed between the dice 134 and respective engraved leads 124, the dice 134 and respective leads 122, the die pad 138 and respective engraved leads 124, and the dice 134 and respective leads 122.

After the electrical connections 136 are formed, the fourth step 508 is carried out. In the fourth step 508, the lead frame 152, the dice 134, the discrete electrical components 130, 132, and the electrical connections 136 are encased in a molding compound 156. The molding compound 156 is a non-conductive material. Furthermore, the molding compound 156 may be an epoxy, an encapsulant, or any other material for encasing components of semiconductor packages. Although the molding compound 156 encases the lead frame 152, the dice 134, the discrete electrical components 130, 132, and the electrical connections, surfaces of the lead frame 152 are left exposed so that semiconductor packages 300, 400 can be mounted within or to an electronic device. More specifically, surfaces of the leads 122, the engraved leads 124, and the die pads 134 are left exposed. Once the molding compound is placed it is allowed to cure. For example, the molding compound may be cured in a static oven at 180° C. for an hour, 150° C. for an hour, or for any time or any temperature in order to cure the molding compound.

After the molding compound 156 has been placed and cured, the fifth step 510 is carried out. In the fifth step 510, the semiconductor packages 300, 400 are singulated into individual and distinct semiconductor packages 300, 400. The components of the semiconductor packages may be singulated by saw singulation, laser singulation, or some other singulation technique. Each individual and distinct semiconductor package 300, 400 includes leads 122, 124, a die pad 138, a die 134, discrete electrical components 130, 132, electrical connections 136, and a molding compound 120.

Figure 13:
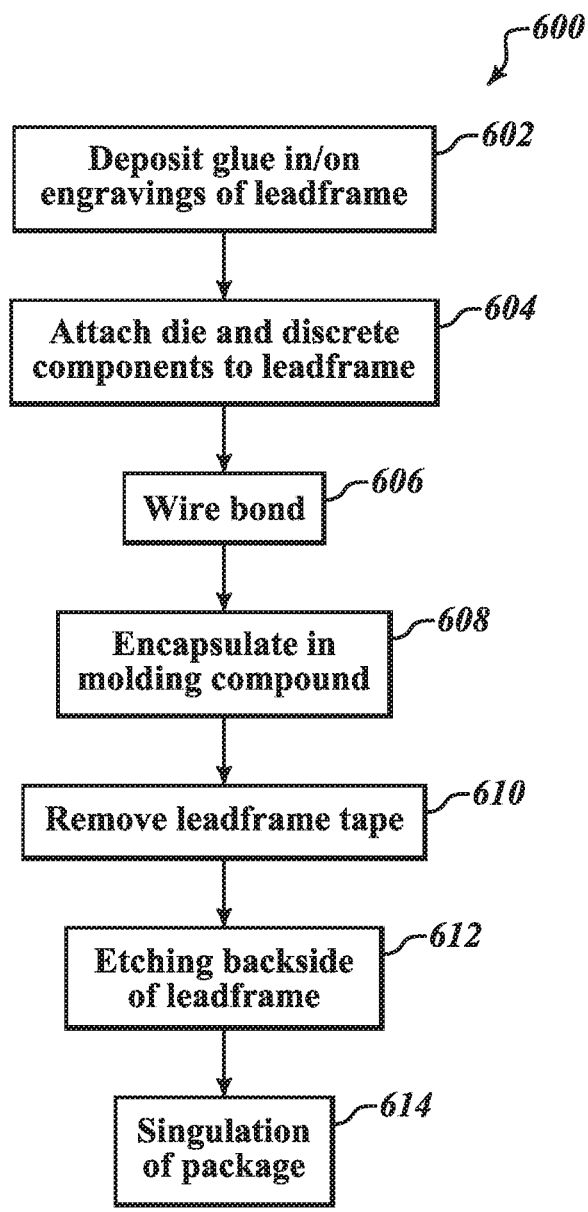
FIG. 13 is a flow chart diagram of successive steps of an alternative semiconductor package formation process utilizing a lead frame with engraved regions according to FIG. 11.

FIG. 13 is directed to a flow chart 500 of an alternative method illustrated in FIG. 11. More specifically, FIG. 13 has the same steps as FIG. 12, however, FIG. 13 also includes an attach support to lead frame step 602 and a remove support step 612. In the attach support to lead frame step 602, a support 164 is coupled to the second side of the lead frame at the beginning of this alternative method. The support 164 may be a lead frame tape, a removable support material, or some other support that can be removed later in this alternative method.

The other step that is included in this alternative method in FIG. 13 that is not present in the flow chart in FIG. 12 is the remove support step 612. This step occurs after the molding compound has been placed and cured encasing the various components of the semiconductor packages in step 610. In this step, the support 164 is removed from the lead frame 152 so that the lead frame 152 can be etched in step 614 and the semiconductor packages 300, 400 can be singulated into individual and distinct semiconductor packages in step 616 like in the flow chart in FIG. 12.

By utilizing the methods discussed above and lead frames with engraved regions, individual semiconductor packages are manufactured by the hundreds, thousands, or any number as needed. Also, by utilizing a lead frame with engraved regions that have high regions and low regions cross-talk between electrical components within the semiconductor packages due to displaced or misplaced conductive adhesive is significantly reduced. For example, if too much conductive adhesive is placed or the conductive adhesive has a high wettability, when discrete electrical components are coupled by the conductive adhesive to engraved regions of a lead frame, the conductive adhesive that is displaced or misplaced fills the low regions which act as a boundary that contains a conductive adhesive. In turn, low regions of engraved regions control where a conductive adhesive is located within a semiconductor package. Likewise, by utilizing the disclosed methods above, the physical and electrical connections between discrete electrical components and engraved regions of a lead frame are stronger. The connections are physically stronger because a conductive adhesive will interlock with a high region of an engraved portion of a lead frame. Similarly, the connections are electrically stronger because a conductive adhesive will have a greater contact surface area with each engraved portion due to the combination of a high region and a low region. The same goes for when the engraved region is only a recess with walls as well. Thus, the packages manufactured using the above disclosed methods will have a significantly lower chance of being defective due to conductive adhesive being misplaced or displaced into unwanted locations within each semiconductor package. Additionally, each semiconductor package will have stronger electrical and physical connections between discrete electrical components and engraved regions of a lead frame.

In addition, by utilizing a die pad with an engraved region and leads with engraved regions to confine and contain a conductive adhesive, semiconductor packages can be made smaller as less leads and electrical connections are needed to form the appropriate electrical connections within semiconductor packages.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor package, comprising:
 a lead frame having a first side and a second side, the lead frame including:
  an engraved lead having a first engraved region on the first side of the lead frame, the first engraved region including:
   a first recess extending into the first side of the engraved lead toward the second side of the engraved lead, the first recess having a first end located within the engraved lead; and
   a first high region that is surrounded by the first recess, a surface of the first high region being spaced from the first end of the first recess;
  a die pad having a second engraved region on the first side, the second engraved region including:
   a second recess extending into the first side of the die pad toward the second side of the die pad, the second recess having a second end located within the die pad; and
   a second high region that is surrounded by the second recess, a surface of the second high region being spaced from the second end of the second recess;
 a discrete electrical component having a first end electrically and physically coupled to the first high region and a second end electrically and physically coupled to the second high region;
 a die electrically and physically coupled to the first side of the die pad, the die being spaced from the discrete electrical component; and
 a molding compound encasing the lead frame, the die, and the discrete electrical component.

2. The semiconductor package of claim 1, wherein a conductive adhesive couples the discrete electrical component to the first engraved region and the second engraved region.

3. The semiconductor package of claim 2, wherein the conductive adhesive couples the first end of the discrete electrical component to the first high region of the engraved lead.

4. The semiconductor package of claim 2, wherein the first recess is configured to receive overflow of the conductive adhesive that couples the discrete electrical component to the first engraved region.

5. The semiconductor package of claim 2, wherein the conductive adhesive couples the second end of the discrete electrical component to the second high region of the die pad.

6. The semiconductor package of claim 2, wherein the second recess is configured to receive overflow of the conductive adhesive that couples the discrete electrical component to the second engraved region.

7. The semiconductor package of claim 1, wherein the engraved lead and the die pad having a surface on the second side of the lead frame, the surface of the engraved lead and the die pad being covered by a first conductive material, the first conductive material is a selectively chemically resistant conductive material.

8. The semiconductor package of claim 1, wherein an adhesive couples the die to the die pad and the die is adjacent to the second engraved region of the die pad.

9. A semiconductor package, comprising:
a lead frame having a first surface and a second surface, the first surface facing away from the second surface, the lead frame including:
a plurality of engraved leads, each engraved lead having a first engraved region and a first height between the first surface and the second surface, the first engraved region including a hill and a trough, the trough being adjacent to and surrounding the hill, the trough extending into the first surface a second height toward the second surface, the second height being less than the first height;
a die pad having a second engraved region and the first height, the second engraved region including a hill and a trough, the trough being adjacent to and surrounding the hill, the trough extending into the first surface of the lead frame by a third height toward the second surface of the lead, the third height being less than the first height;
a first discrete electrical component electrically and physically coupled between a first hill and a second hill of the plurality of engraved leads;
a second discrete electrical component electrically and physically coupled between a third hill of the plurality of engraved leads and a fourth hill of the second engraved region of the die pad;
a die electrically and physically coupled to the first surface of the die pad, the die being spaced from the first discrete electrical component and the second discrete electrical component; and
a molding compound encasing the lead frame, the first and second discrete electrical components, and the die.

10. The semiconductor package of claim 9 further comprising:
a plurality of leads;
a first electrical connection electrically and physically coupled between at least one of the engraved leads and the die; and
a second electrical connection electrically and physically coupled between the die and one of the leads of the plurality of leads, the first and second electrical connections being wires.

11. The semiconductor package of claim 9, further comprises:
a first conductive adhesive coupling a first end of the first discrete electrical component to the first hill; and
a second conductive adhesive coupling a second end of the first discrete electrical component to the second hill.

12. The semiconductor package of claim 11, further comprises:
a third conductive adhesive coupling a third end of the second discrete electrical component to the third hill; and
a fourth conductive adhesive coupling a fourth end of the second discrete electrical component to the fourth hill.

13. The semiconductor package of claim 12, wherein each trough adjacent to each hill is configured to receive a respective portion of one of the first conductive adhesive, the second conductive adhesive, the third conductive adhesive, and the fourth conductive adhesive.

14. The semiconductor package of claim 9, wherein an adhesive couples the die to the die pad and the die is adjacent to the second engraved region of the die pad.

15. A semiconductor package, comprising:
a lead frame having a first surface and a second surface, the second surface facing away from the first surface, the lead frame including:
a first lead with a first recess extending into the first surface of the first lead toward the second surface of the first lead, the first recess terminating within the first lead, the first lead including a first high region that is surrounded by the first recess;
a second lead with a second recess extending into the first surface of the second lead toward the second surface of the second lead, the second recess terminating within the second lead, the second lead including a second high region that is surrounded by the second recess; and
a die pad separated from the first lead and the second lead;
a die electrically and physically coupled to the die pad; and
a first discrete electrical component having a first end electrically and physically coupled to the first high region and a second end electrically and physically coupled to the second high region, the first discrete electrical component being spaced from the die.

16. The semiconductor package of claim 15, wherein the lead frame further comprises a third lead with a third recess extending into the first surface of the third lead, the third recess terminating within the third lead.

17. The semiconductor package of claim 16, further comprising a die pad that includes a fourth recess extending into the first surface of the die pad, the fourth recess being adjacent to a die, the fourth recess terminating within the die pad.

18. The semiconductor package of claim 17, further comprising a second discrete electrical component electrically and physically coupled to a third high region surrounded by the third recess of the third lead and a fourth high region surrounded by the fourth recess of the die pad.

19. The semiconductor package of claim 18, wherein the third recess and the fourth recess are filled by a conductive adhesive, the conductive adhesive coupling the second discrete electrical component to the third recess and the fourth recess.

20. The semiconductor package of claim 15, further comprising a conductive adhesive filling the first recess and the second recess, the conductive adhesive coupling the first discrete electrical component to the first recess and the second recess.

* * * * *